United States Patent
Sinitsky et al.

(10) Patent No.: US 9,000,852 B1
(45) Date of Patent: Apr. 7, 2015

(54) METHOD AND APPARATUS FOR STARTING UP OSCILLATION

(71) Applicant: Marvell International Ltd., Hamilton (BM)

(72) Inventors: Dennis Sinitsky, Sunnyvale, CA (US); Junshi Qiao, Beijing (CN); Pei Wang, Shanghai (CN); Song Chen, Shanghai (CN); Haiqing Zhang, Shanghai (CN); Tao Shui, Cupertino, CA (US)

(73) Assignee: Marvell International Ltd., Hamilton (BM)

( * ) Notice: Subject to any disclaimer, the term of this patent is extended or adjusted under 35 U.S.C. 154(b) by 79 days.

(21) Appl. No.: 13/672,338

(22) Filed: Nov. 8, 2012

Related U.S. Application Data

(60) Provisional application No. 61/557,279, filed on Nov. 8, 2011.

(51) Int. Cl.
*H03B 5/30* (2006.01)
*H03B 5/36* (2006.01)
*H03L 7/00* (2006.01)

(52) U.S. Cl.
CPC *H03L 7/00* (2013.01); *H03B 5/362* (2013.01); *H03B 5/36* (2013.01); *H03B 5/366* (2013.01); *H03B 5/364* (2013.01)

(58) Field of Classification Search
CPC .......... H03B 5/36; H03B 5/362; H03B 5/364; H03B 5/366; H03L 7/00
USPC ..... 331/73, 116 R, 116 FE, 116 M, 154, 158, 331/160, 47
See application file for complete search history.

(56) References Cited

U.S. PATENT DOCUMENTS

| | | | | |
|---|---|---|---|---|
| 6,057,742 | A * | 5/2000 | Prado | 331/158 |
| 6,977,557 | B1 * | 12/2005 | Frerking | 331/173 |
| 7,336,134 | B1 * | 2/2008 | Janesch et al. | 331/36 C |
| 7,388,443 | B2 * | 6/2008 | Baig et al. | 331/57 |
| 2010/0271140 | A1 * | 10/2010 | Raghunathan et al. | 331/34 |
| 2011/0032972 | A1 * | 2/2011 | Wang et al. | 375/130 |
| 2011/0241786 | A1 * | 10/2011 | Gilbert | 331/34 |

OTHER PUBLICATIONS

U.S. Appl. No. 13/735,223, filed Jan. 7, 2013 by Haiqing Zhang, et al., entitled "Method and Apparatus for Starting Up Oscillation."

* cited by examiner

*Primary Examiner* — Arnold Kinkead
*Assistant Examiner* — Richard Tan

(57) ABSTRACT

Aspects of the disclosure provide a circuit. The circuit includes a signal amplifying circuit coupled with a crystal component of a natural frequency to form a crystal oscillator, and a signal generator circuit configured to generate a signal with an energy distribution about the natural frequency, and to provide the signal to the crystal oscillator to assist the crystal oscillator to begin oscillating.

21 Claims, 5 Drawing Sheets

METHOD AND APPARATUS FOR STARTING UP OSCILLATION

INCORPORATION BY REFERENCE

This present disclosure claims the benefit of U.S. Provisional Application No. 61/557,279, "XTAL Noise Injection to Speed Up Start Up" filed on Nov. 8, 2011, which is incorporated herein by reference in its entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Generally, when power is first applied to a system, it takes a time period for a crystal oscillator to build up a magnitude of an oscillation signal to a relatively stable level. Based on the stabled oscillation signal, a system clock is generated. Then, the system clock is distributed in the system, and used by various circuits in the system.

SUMMARY

Aspects of the disclosure provide a circuit. The circuit includes a signal amplifying circuit coupled with a crystal component of a natural frequency to form a crystal oscillator, and a signal generator circuit configured to generate a signal with an energy distribution about the natural frequency, and to provide the signal to the crystal oscillator to assist the crystal oscillator to begin oscillating.

Further, the circuit includes an interface circuit configured to couple the signal to the signal amplifying circuit when the circuit is powered up. In an example, the interface circuit is configured to decouple the signal from the signal amplifying circuit after a time duration.

According to an aspect of the disclosure, the signal generator circuit is configured to generate the signal with energy distributed in a frequency range about the natural frequency. In an embodiment, the signal generator circuit includes a ring oscillator configured to generate an oscillation signal with a frequency varying in the frequency range. In an example, the signal generator circuit includes a plurality of switchable capacitors configured to vary a capacitance load of the ring oscillator. For example, the signal generator circuit includes a control signal generator configured to generate control signals to control the plurality of switchable capacitors.

Aspects of the disclosure provide a method. The method includes generating a signal with an energy distribution in a frequency range about a natural frequency of a crystal component, and providing the signal to a crystal oscillator formed by the crystal component to assist the crystal oscillator to begin oscillating.

Aspects of the disclosure provide a system. The system includes a crystal component configured to have a natural frequency, a signal amplifying circuit coupled with the crystal component to form a crystal oscillator, and a signal generator circuit configured to generate a signal with an energy distribution about the natural frequency, and to provide the signal to the crystal oscillator to assist the crystal oscillator to begin oscillating.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

Figure 1:
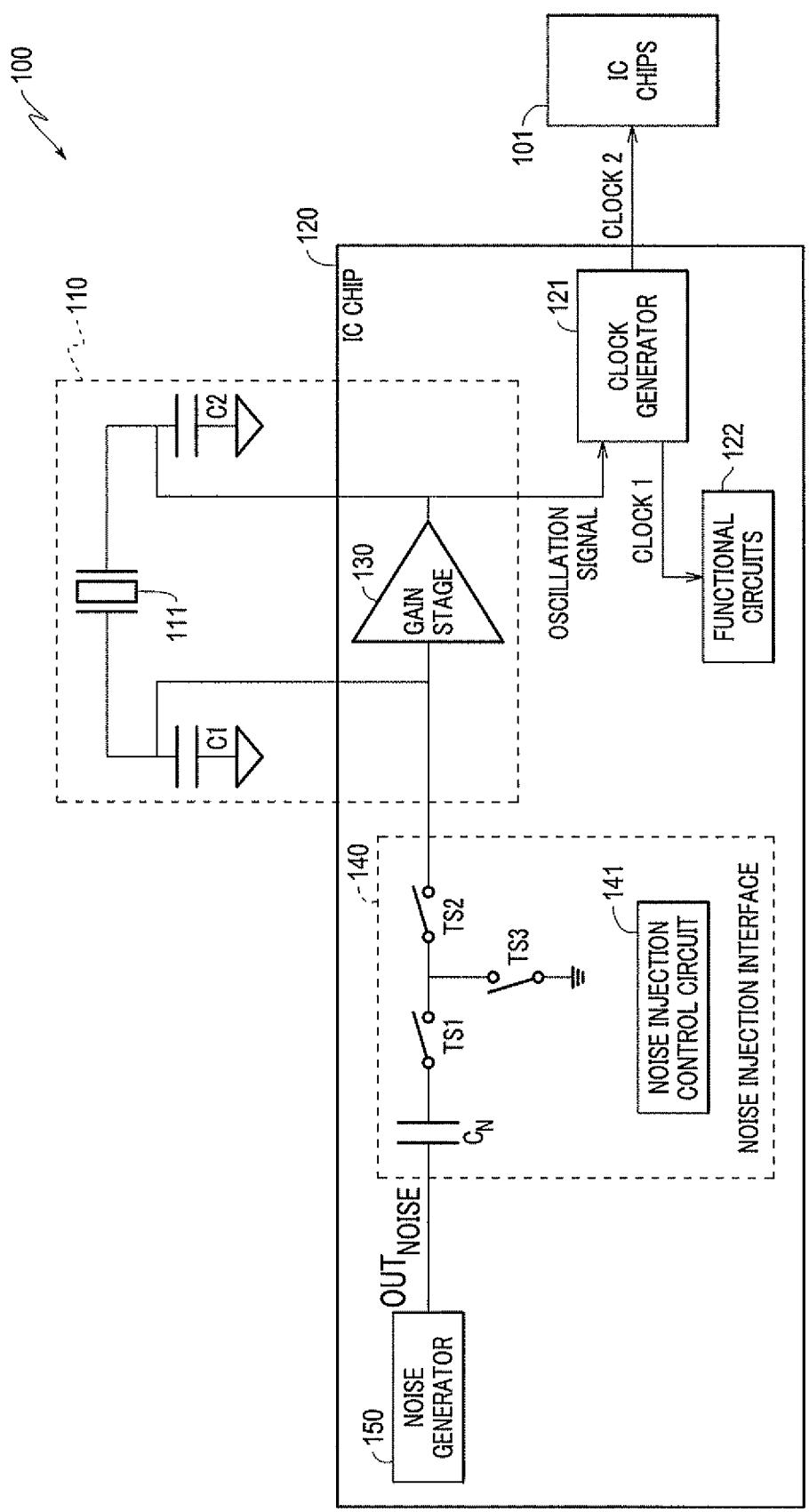
FIG. 1 shows a diagram of an electronic system example 100 according to an embodiment of the disclosure.

FIG. 1 shows a diagram of an electronic system example 100 according to an embodiment of the disclosure. The electronic system 100 includes a crystal oscillator 110 to provide an oscillation signal for generating a system clock in the electronic system 100. In addition, the electronic system 100 includes a noise generator 150 configured to provide a noise signal to the crystal oscillator 110 to assist the crystal oscillator 100 to start oscillation, and to achieve a stable level of amplitude in a relatively short time.

In the FIG. 1 example, the crystal oscillator 110 includes a crystal component 111, a gain stage 130, and capacitors C1 and C2. These elements are coupled together as shown in FIG. 1. The crystal component 111, such as a quartz crystal, has a natural frequency $f_T$ that is substantially fixed for the crystal component 111. The crystal component 111 behaves like a filter to allow a signal portion that has the natural frequency $f_T$ (an oscillation signal of the natural frequency $f_T$) to pass through, and to attenuate other signal portions.

The gain stage 130 includes any suitably circuits to amplify signals received at its input. The capacitors C1 and C2 are used to stabilize the operation of the crystal oscillator 110.

In operation, when power is first applied to the crystal oscillator 110, the gain stage 130 amplifies signals received at its input, such as the noise signal provided by the noise generator 150, thermal noise, and the like. The crystal component 111 filters the amplified signals to let the signal portion that has the natural frequency $f_T$ to pass through, and generate the oscillation signal of the natural frequency $f_T$. The gain stage 130 then further amplifies the oscillation signal and other signals received at its input. This process continues until the oscillation signal reaches a relatively stable level, which is typically governed by a power supply voltage level of the gain stage 130. The time duration from the power being applied to the oscillation signal being stable is referred to as a start-up time for oscillation.

According to an embodiment of the disclosure, at the time when the power is first applied, the noise generator 150 intentionally generates and provides the noise signal to the crystal oscillator 110. The noise signal has energy distribution on the natural frequency $f_T$. In an example, the energy distribution of the noise signal on the natural frequency $f_T$ is much larger than thermal noise in the circuit. Thus, based on the noise signal, the crystal oscillator 110 takes less time to achieve the stable amplitude of oscillation, and has a reduced start-up time for oscillation compared to thermal noise based start-up time for oscillation.

Specifically, in an embodiment, the gain stage 130 and the noise generator 150 are implemented on an integrated circuit (IC) chip 120 in the electronic system 100. Further, the IC chip 120 includes a noise injection interface 140 configured to couple/decouple the noise generator 150 to the crystal oscillator 110.

In the FIG. 1 example, the noise generator 150 is configured to generate a noise signal $OUT_{NOISE}$ when power is applied to the IC chip 120, for example. The noise signal $OUT_{NOISE}$ has a larger energy distribution at the natural frequency $f_T$ than thermal noise in the circuit. The noise injection interface 140 is configured to couple the noise signal $OUT_{NOISE}$ to the input of the gain stage 130 when the power is first applied to the IC chip 120.

Further, according to an embodiment of the disclosure, the noise injection interface 140 decouples the noise signal $OUT_{NOISE}$ from the crystal oscillator 110 after a suitable time, such as after a pre-determined time period, when the oscillation signal is stable, and the like.

In an example, the noise injection interface 140 includes a capacitor $C_N$ for noise coupling, a T switch formed by switches TS1-TS3, and a noise injection control circuit 141. The noise injection control circuit 141 provides control signals to the switches TS1-TS3. It is noted that the switches TS1-TS3 can be implemented using any suitable techniques, such as using metal-oxide-semiconductor (MOS) transistors.

During operation, in an example, when power is first applied to the IC chip 120, the noise injection control circuit 141 provides control signals to the switches TS1-TS3 to close the switches TS1 and TS2, and open the switch TS3, such that the noise generator 150 is AC-coupled to the input of the gain stage 130, and thus the input of the gain stage 130 receives the noise signal generated by the noise generator 150.

Then, after a suitable time duration, the noise injection control circuit 141 adjusts the control signals to the switches TS1-TS3 to close the switches TS1 and TS3 and open the switch TS2, such that the noise generator 150 is decoupled from the input of the gain stage 130.

It is noted that, in another embodiment, after a suitable time duration, the noise generator 150 is disabled, and thus stops providing the noise signal $OUT_{NOISE}$ to the crystal oscillator 110.

According to an aspect of the disclosure, the electronic system 100 generates a system clock based on the stable oscillation signal, and distributes the system clock to circuits in the electronic system 100. For example, the IC chip 120 includes a clock generator 121 configured to generate one or more clock signals based on the oscillation signal. For example, the clock generator 121 generates a first clock signal CLOCK_1, and provides the first clock signal CLOCK_1 to functional circuits 122 on the IC chip 120. In addition, the clock generator 121 generates a second clock signal CLOCK_2 and provides the second clock signal CLOCK_2 to components out of the IC chip 120, such as other IC chips 101, and the like.

It is noted that the electronic system 100 can be suitably modified. For example, the noise generator 150 is out of the IC chip 120 in an embodiment. Further, in an example, the noise generator 150 is powered up at the same time as the IC chip 120 or before the IC chip 120.

The noise generator 150 can be implemented by various techniques.

Figure 2:
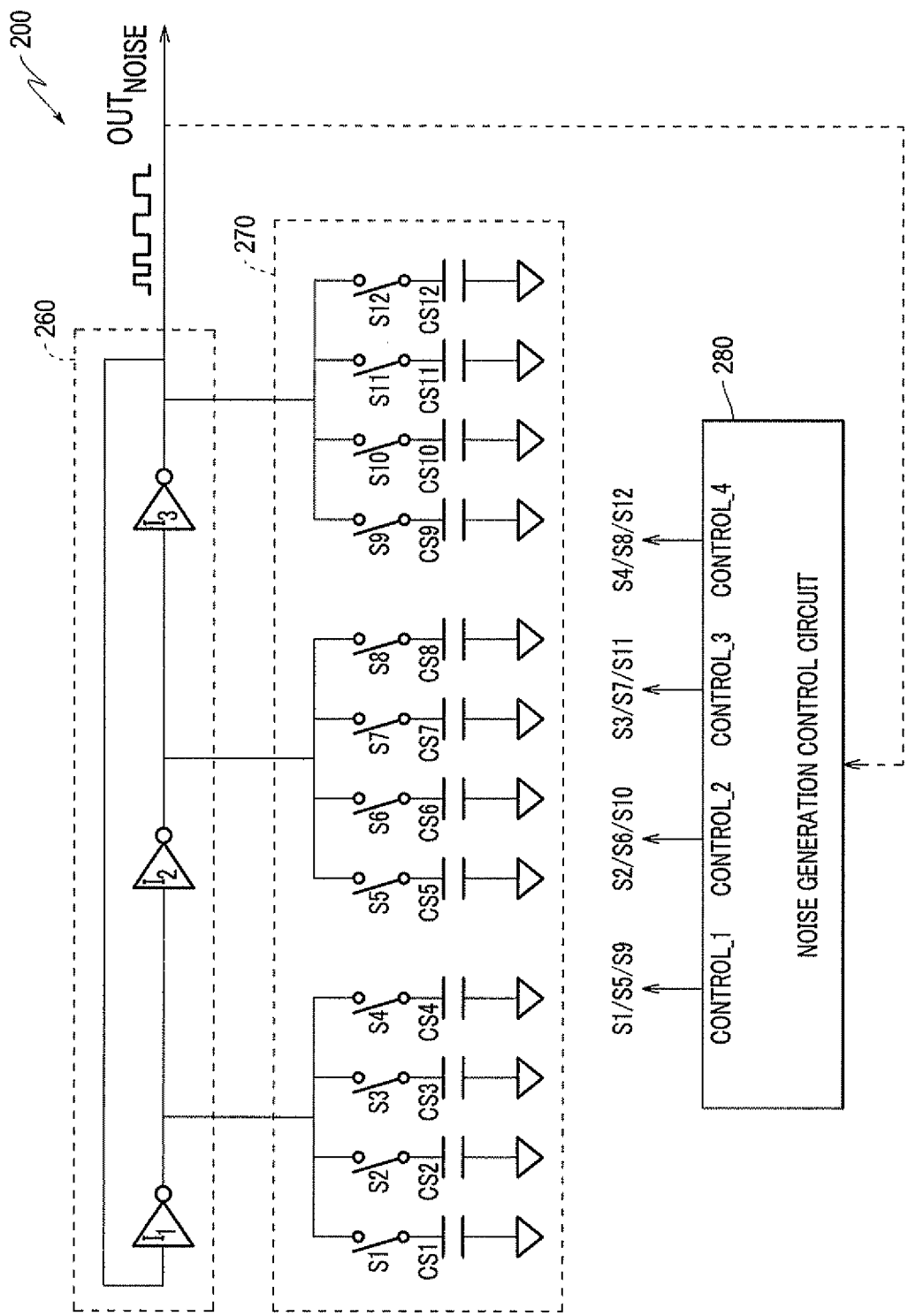
FIG. 2 shows a diagram of a noise generator example according to an embodiment of the disclosure.

FIG. 2 shows a diagram of a noise generator example 250 according to an embodiment of the disclosure. The noise generator 250 includes a ring oscillator 260, a switchable capacitor bank 270 and a noise generation control circuit 280. These elements are coupled together as shown in FIG. 2.

The ring oscillator 260 generates an oscillation signal $OUT_{NOISE}$. The ring oscillator 260 can be implemented by various techniques. In an example, the ring oscillator 260 includes an odd number of inverters I1-I3 serially coupled together in a ring.

The switchable capacitor bank 270 includes a plurality of capacitors CS1-CS12 that can be coupled to the ring oscillator 260 as capacitance load. In an example, each of the capacitors CS1-CS12 is coupled with a switch (one of S1-S12) in series. When the switch is closed, the capacitor is coupled to the ring oscillator 260; and when the switch is open, the capacitor is decoupled from the ring oscillator 260. By controlling the switches S1-S12, the capacitance load of the ring oscillator 260 varies, and thus the frequency of the oscillation signal $OUT_{NOISE}$ varies.

The switches S1-S12 can be implemented using various techniques, such as MOS transistors.

The noise generation control circuit 280 generates control signals to couple and decouple the plurality of capacitors CS1-CS12 to the ring oscillator 260.

In the FIG. 2 example, CS1-CS4 are switchable capacitance load for the inverter I1, CS5-CS8 are switchable capacitance load for the inverter I2, and CS9-CS12 are switchable capacitance load for the inventor I3. In addition, in an example, CS1, CS5 and CS9 have the same capacitance, such as one-unit capacitance (1C); CS2, CS6 and CS10 have the same capacitance, such as two-unit capacitance (2C); CS3, CS7 and CS11 have the same capacitance, such as four-unit capacitance (4C); and CS4, CS8 and CS12 have the same capacitance, such as eight-unit capacitance (8C). S1-S12 are respectively coupled with CS1-CS12.

The noise generation control circuit 280 generates controls signals CONTROL_1 to CONTROL_4 to control the switches S1-S12. For example, the control signal CONTROL_1 controls switches S1, S5 and S9; the control signal CONTROL_2 controls switches S2, S6 and S10; the control signal CONTROL_3 controls switches S3, S7 and S11; the control signal CONTROL_4 controls switches S4, S8 and S12.

In an example, when a control signal is logic "0", the corresponding switch is open, and when the control signal is logic "1", the corresponding switch is closed. Thus, when the control signals CONTROL_1 to CONTROL_4 are "0000", the capacitor CS1-CS12 are decoupled from the ring oscillator 260, and thus the oscillation signal $OUT_{NOISE}$ generated by the ring oscillator 260 has the highest frequency ($f_H$); and when the control signals CONTROL_1 to CONTROL_4 are "1111", the capacitors CS1-CS12 are coupled to the ring oscillator 260, and thus the oscillation signal $OUT_{NOISE}$ generated by the ring oscillator 260 has the lowest frequency ($f_L$).

In an example, the noise generator 250 is suitably configured that the highest frequency $f_H$ is higher than the natural frequency $f_T$, and the lowest frequency $f_L$ is lower than the natural frequency $f_T$ of the crystal component 111.

During operation, the noise generation control circuit 280 varies the control signals CONTROL_1 to CONTROL_4 to vary the capacitance load in order to spread out the frequency of the oscillation signal $OUT_{NOISE}$. Thus, energy is spread out in a frequency range that includes the natural frequency $f_T$.

Figure 3:
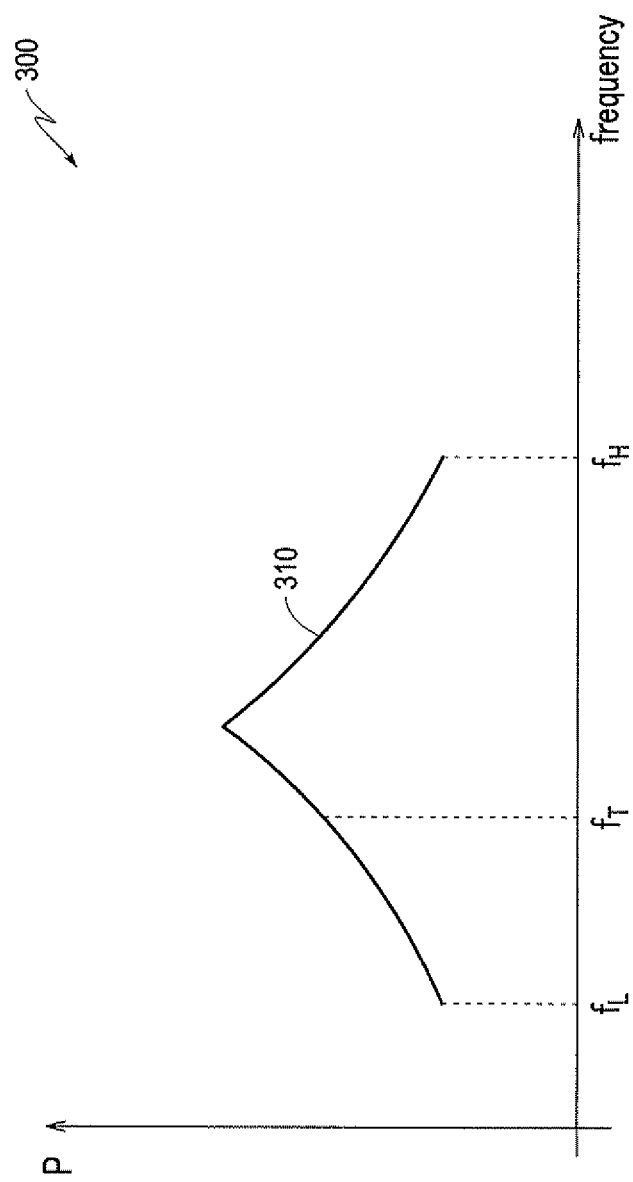
FIG. 3 shows a plot of a power spectrum example 300 according to an embodiment of the disclosure.

FIG. 3 shows a plot 300 of a power spectrum example for the oscillation signal $OUT_{NOISE}$ according to an embodiment of the disclosure. In the plot, the X-axis is frequency, and the Y-axis is power. The highest frequency $f_H$ is higher than the natural frequency $f_T$, and the lowest frequency $f_L$ is lower than the natural frequency $f_T$ of the crystal component 111.

In an example, during a design process for the IC chip 120, a range of the natural frequency $f_T$ of the crystal component 111 is specified in a design specification, and thus is pre-known to designers. Then, the noise generator 250 is suitably designed that the highest frequency $f_H$ is higher than the upper limit of the specified range, and the lowest frequency $f_L$ is lower than the lower limit of the specified range of the crystal component 111.

In the FIG. 3 example, the plot 300 includes a curve 300 shows energy spread out in the frequency range $[f_L, f_H]$. According to an aspect of the disclosure, the energy distribution on the natural frequency $f_T$ is higher than thermal noise.

It is noted that the noise generation control circuit 280 can use any suitably techniques, such as in a deterministic manner, in a random manner, in a pseudo random manner, and the like, to generate the control signals CONTROL_1 to CONTROL_4, and to spread out energy in the frequency range.

Figure 4:
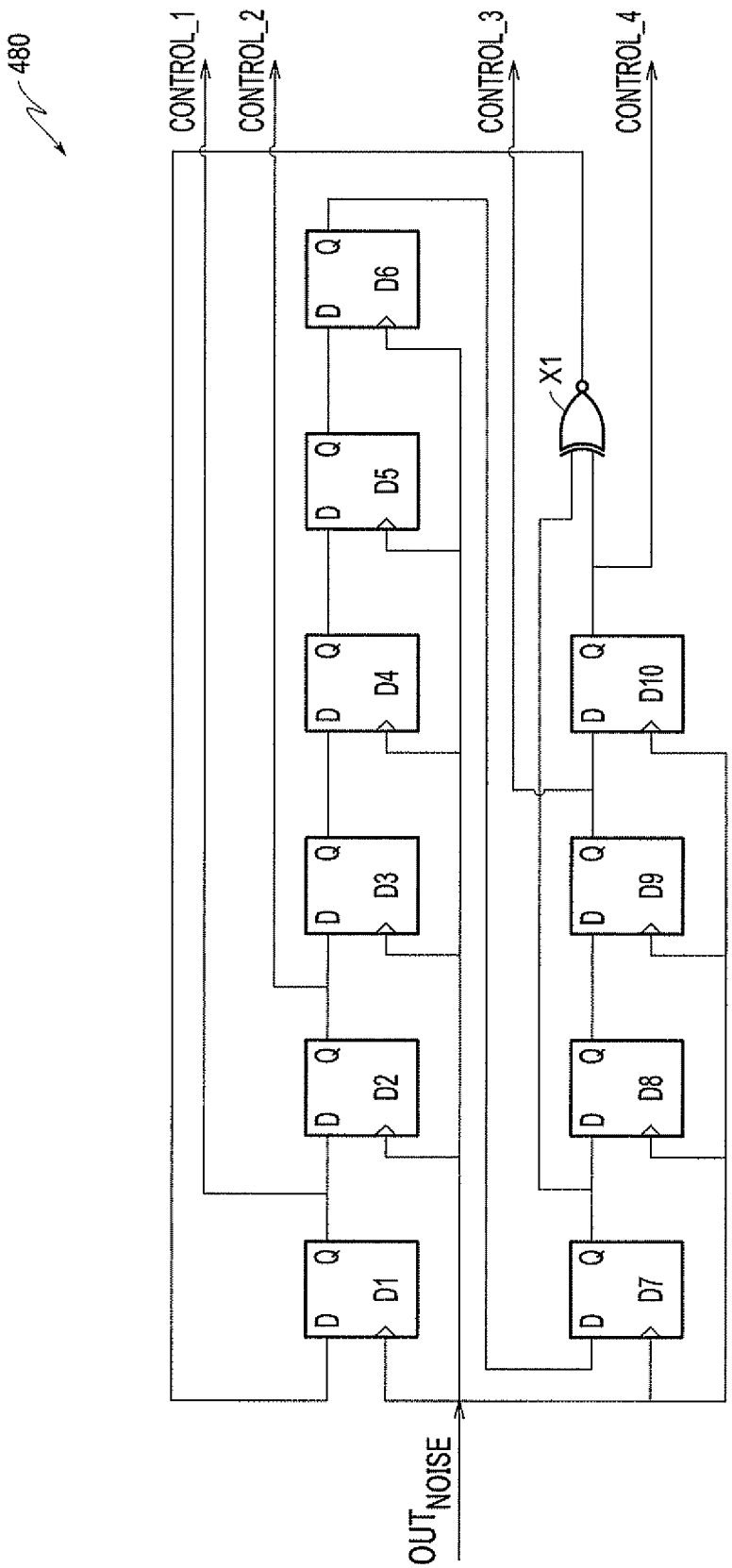
FIG. 4 shows a diagram of a noise generation control circuit example 480 according to an embodiment of the disclosure.

FIG. 4 shows a diagram of a noise generation control circuit example 480 according to an embodiment of the disclosure. The noise generation control circuit 480 includes a plurality of D flip-flops D1-D10, and logic circuits, such as an XOR gate X1, and the like. The D flip-flops D1-D10 and the logic circuits are suitably coupled together to generate the control signals CONTROL_1 to CONTROL_4.

In the FIG. 4 example, the oscillation signal $OUT_{NOISE}$ is used as clock signals for the D flip-flops D1-D10.

Figure 5:
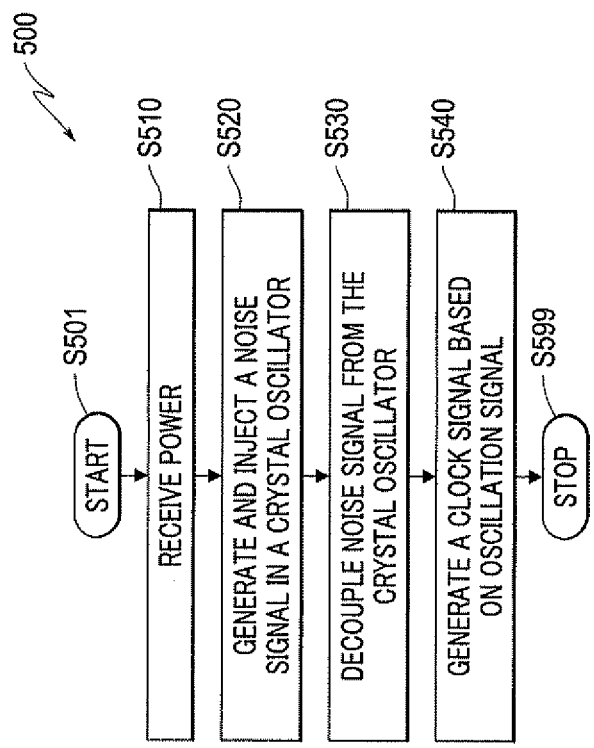
FIG. 5 shows a flowchart outlining a process example according to an embodiment of the disclosure.

FIG. 5 shows a flow chart outlining a process example 500 for the electronic system 100 to generate a clock signal according to embodiment of the disclosure. The process starts at S501 and proceeds to S510.

At S510, the electronic system 100 receives power. In an example, when a power switch of the electronic system 100 is turned on, electric power is applied to the electronic system 100 and is suitably distributed in the electronic system 100. In another embodiment, a portion of the electronic system 100, such as the IC chip 120, is powered off in a mode. When the electronic system 100 exits the mode, electric power is applied to the IC chip 120.

At S520, a noise signal, such as the oscillation signal $OUT_{NOISE}$ with varying frequency, is intentionally generated, and injected into the crystal oscillator 110 to assist the crystal oscillator 110 to start oscillation. In an embodiment, the noise injection interface 140 is configured to couple the noise generator 150 to the crystal oscillator 110 at the time when the power is first received to inject the oscillation signal $OUT_{NOISE}$ into the crystal oscillator 110. In an example, the energy of the noise signal spread on the natural frequency $f_T$ of the crystal oscillator 110 is higher than thermal noise. Thus, the start-up time for oscillation based on the noise signal is less than the start-up time for oscillation based on thermal noise. According to a simulation example of a 32 MHz crystal oscillator, based on the oscillation signal $OUT_{NOISE}$ generated by the noise generator 250, the start-up time for oscillation is about 240 μs; and without injection of the noise signal, the start-up time for oscillation is about 500 μs. Further, tests are conducted in real electronic systems. The test results also show that a 32 MHz crystal oscillator can start up within 250 μs with the noise injection according to the disclosure.

At S530, the noise signal is decoupled from the crystal oscillator 110. In an embodiment, the noise injection interface 140 is configured to decouple the noise generator 150 from the crystal oscillator 110 after a suitable time duration.

At S540, a clock signal is generated based on the oscillation signal generated by the crystal oscillator 110. In an example, the clock signal is a system clock and is provided to various circuits in the electronic system 100. Then, the process proceeds to S599 and terminates.

It is noted that steps in the process 500 can be executed at the same time or in a different order. In an example, the noise signal is decoupled from the crystal oscillator 110 after the clock signal is generated.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. A circuit, comprising:
    a signal amplifying circuit coupled with a crystal component of a natural frequency to form a crystal oscillator;
    a signal generator circuit configured to generate a signal with an energy distribution about the natural frequency, and provide the signal to the crystal oscillator to assist the crystal oscillator to begin oscillating;
    a ring oscillator configured to feed back the signal via at least two or more inverters coupled in series to the ring oscillator, each inverter coupled with a group of capacitors, wherein a first capacitor in the group has a first capacitance which is greater than a second capacitance of a second capacitor in the group and wherein the first capacitor is physically adjacent to the second capacitor; and
    a noise generation control circuit configured to randomly generate control signals to switch on and off the capacitors to the ring oscillator.

2. The circuit of claim 1, further comprising:
    an interface circuit configured to couple the signal to the signal amplifying circuit when the circuit is powered up.

3. The circuit of claim 2, wherein the interface circuit is configured to decouple the signal from the signal amplifying circuit after a time duration.

4. The circuit of claim 1, wherein the signal generator circuit is configured to generate the signal with energy distributed in a frequency range about the natural frequency.

5. The circuit of claim 4, wherein the ring oscillator is further configured to generate an oscillation signal with a frequency varying in the frequency range.

6. The circuit of claim 5, wherein the group of capacitors are a plurality of switchable capacitors configured to vary a capacitance load of the ring oscillator.

7. The circuit of claim 1, wherein the noise generation control circuit is further configured to receive the signal from the ring oscillator.

8. The circuit of claim 1, wherein the noise generation control circuit includes a plurality of flip-flops and an Exclusive OR (XOR) logic circuit.

9. A method, comprising:
    generating a signal with an energy distribution in a frequency range about a natural frequency of a crystal component;
    providing the signal to a crystal oscillator formed by the crystal component to assist the crystal oscillator to begin oscillating;
    feeding back the signal by a ring oscillator via at least two or more inverters coupled in series to the ring oscillator, each inverter coupled with a group of capacitors, wherein a first capacitor in the group has a first capacitance which is greater than a second capacitance of a second capacitor in the group and wherein the first capacitor is physically adjacent to the second capacitor;

randomly generating control signals to switch on and off the capacitors to the ring oscillator by a noise generation control circuit.

10. The method of claim 9, further comprising:
providing the signal to the crystal oscillator at a time of power-up.

11. The method of claim 9, further comprising:
decoupling the signal from the crystal oscillator after a time duration.

12. The method of claim 9, wherein generating the signal with energy distribution in the frequency range about the natural frequency of the crystal component further comprises:
generating an oscillation signal with a varying frequency in the frequency range.

13. The method of claim 12, wherein generating the oscillation signal with the varying frequency in the frequency range further comprises:
varying a capacitance load of the ring oscillator.

14. The method of claim 13, wherein varying the capacitance load of the ring oscillator further comprises:
switching in/out capacitors.

15. A system, comprising:
a crystal component configured to have a natural frequency;
a signal amplifying circuit coupled with the crystal component to form a crystal oscillator;
a signal generator circuit configured to generate a signal with an energy distribution about the natural frequency, and provide the signal to the crystal oscillator to assist the crystal oscillator to begin oscillating;
a ring oscillator configured to feed back the signal via at least two or more inverters coupled in series to the ring oscillator, each inverter coupled with a group of capacitors, wherein a first capacitor in the group has a first capacitance which is greater than a second capacitance of a second capacitor in the group and wherein the first capacitor is physically adjacent to the second capacitor; and
a noise generation control circuit configured to randomly generate control signals to switch on and off the capacitors to the ring oscillator.

16. The system of claim 15, further comprising:
an interface circuit configured to couple the signal to the signal amplifying circuit when power is applied to the system.

17. The system of claim 16, wherein the interface circuit is configured to decouple the signal from the signal amplifying circuit after a time duration.

18. The system of claim 15, wherein the signal generator circuit is configured to generate the signal with energy distributed in a frequency range about the natural frequency.

19. The system of claim 18, wherein the ring oscillator is further configured to generate an oscillation signal with a frequency varying in the frequency range.

20. The system of claim 19, wherein the signal generator circuit further comprises:
a plurality of switchable capacitors configured to change a capacitance load of the ring oscillator.

21. The system of claim 15, wherein the noise generation control circuit includes a plurality of flip-flops and an Exclusive OR (XOR) logic circuit.

* * * * *